United States Patent [19]

Yamakido

[11] E Patent Number: Re. 32,313

[45] Reissued Date of Patent: Dec. 23, 1986

[54] DIGITAL-TO-ANALOG CONVERTER AND PCM ENCODEK USING THE CONVERTER

[75] Inventor: Kazuo Yamakido, Hachioji, Japan

[73] Assignee: Hitachi, Ltd., Tokyo, Japan

[21] Appl. No.: 692,197

[22] Filed: Jan. 17, 1985

Related U.S. Patent Documents

Reissue of:

[64] Patent No.: 4,369,433
Issued: Jan. 18, 1983
Appl. No.: 185,991
Filed: Sep. 10, 1980

[51] Int. Cl.[4] ..... H03M 1/46
[52] U.S. Cl. ..... 340/347 DA; 340/347 AD
[58] Field of Search ..... 340/347 AD, 347 DA

[56] References Cited

U.S. PATENT DOCUMENTS

| | | | |
|---|---|---|---|
| 3,812,478 | 5/1974 | Tomisawa | 340/347 DA UX |
| 4,195,282 | 3/1980 | Cameron | 340/347 AD |
| 4,198,622 | 4/1980 | Connolly | 340/347 DA |
| 4,200,863 | 4/1980 | Hodges | 340/347 DA |

OTHER PUBLICATIONS

Tsividis et al. "IEEE International Solid-State Circuits Conference" Feb. 18, 1976, p. 24–15.

Caves "IEEE Journal of Solid-State Circuits", vol. SC-14 No. 1, Feb. 1979, pp. 65–73.

Haque "IEEE Journal of Solid-State Circuits" vol. SC-14 No. 6, Dec. 1979, pp. 961–968.

Huggins "IEEE International Solid-State Circuits Conference" Feb. 16, 1978, pp. 178–179.

*Primary Examiner*—Charles D. Miller
*Attorney, Agent, or Firm*—Antonelli, Terry & Wands

[57] ABSTRACT

A PCM encoder for converting a voice signal into a eight-bit code by approximating the $\mu$-low characteristic where $\mu=255$ with 15 segments comprises a capacitor array circuit including eight capacitors for determining lowermost voltages of the segments, a resistor string circuit for producing step voltage in each of the segments, a comparator circuit for comparing the output voltage of the capacitor array circuit with a reference voltage, and a successive approximation register circuit for controlling switch groups provided in the capacitor array circuit and the resistor string circuit. The resistor string circuit is provided with taps for deriving voltages corresponding to $(2n-1)/33$ (where $n=1$–16) of a voltage applied across the resistor string. A PCM encoder which conforms to the $\mu$-low with high fidelity and is capable of quantizing mid-tread at the first segment is disclosed.

13 Claims, 11 Drawing Figures

FIG. 5

| B5 | B6 | B7 | B8 | CLOSED SWITCHES | OUTPUT VOLTAGE ($X^{1/33}$) |
|---|---|---|---|---|---|
| 0 | 0 | 0 | 0 | X16 | 31 |
| 0 | 0 | 0 | 1 | X1 | 1 |
| 0 | 0 | 1 | 0 | X2 | 3 |
| 0 | 0 | 1 | 1 | X3 | 5 |
| 0 | 1 | 0 | 0 | X4 | 7 |
| 0 | 1 | 0 | 1 | X5 | 9 |
| 0 | 1 | 1 | 0 | X6 | 11 |
| 0 | 1 | 1 | 1 | X7 | 13 |
| 1 | 0 | 0 | 0 | X8 | 15 |
| 1 | 0 | 0 | 1 | X9 | 17 |
| 1 | 0 | 0 | 0 | X10 | 19 |
| 1 | 0 | 1 | 1 | X11 | 21 |
| 1 | 1 | 0 | 1 | X12 | 23 |
| 1 | 1 | 0 | 1 | X13 | 25 |
| 1 | 1 | 1 | 0 | X14 | 27 |
| 1 | 1 | 1 | 1 | X15 | 29 |

FIG. 6

| B2 | B3 | B4 | B5+B6+B7+B8 | Y0l | Y1l | Y2l | Y3l | Y4l | Y5l | Y6l | Y7l | OUTPUT VOLTAGE |
|---|---|---|---|---|---|---|---|---|---|---|---|---|
| 0 | 0 | 0 | 0 | 1 | 1 | 1 | 1 | 1 | 1 | 1 | 1 | 0 |
| | | | 1 | 3 | 1 | 1 | 1 | 1 | 1 | 1 | 1 | 1 ~ 29 |
| | | | | | | | | | | | | 31 |
| 0 | 0 | 1 | 0 | 2 | 3 | 1 | 1 | 1 | 1 | 1 | 1 | 35 ~ 91 |
| | | | 1 | | | | | | | | | 95 |
| 0 | 1 | 0 | 0 | 2 | 2 | 3 | 1 | 1 | 1 | 1 | 1 | 103 ~ 215 |
| | | | 1 | | | | | | | | | 223 |
| 0 | 1 | 1 | 0 | 2 | 2 | 2 | 3 | 1 | 1 | 1 | 1 | 239 ~ 463 |
| | | | 1 | | | | | | | | | 479 |
| 1 | 0 | 0 | 0 | 2 | 2 | 2 | 2 | 3 | 1 | 1 | 1 | 511 ~ 959 |
| | | | 1 | | | | | | | | | 791 |
| 1 | 0 | 1 | 0 | 2 | 2 | 2 | 2 | 2 | 3 | 1 | 1 | 1055 ~ 1951 |
| | | | 1 | | | | | | | | | 2015 |
| 1 | 1 | 0 | 0 | 2 | 2 | 2 | 2 | 2 | 2 | 3 | 1 | 2143 ~ 3935 |
| | | | 1 | | | | | | | | | 4063 |
| 1 | 1 | 1 | 0 | 2 | 2 | 2 | 2 | 2 | 2 | 2 | 3 | 4319 ~ 7903 |

DIGITAL-TO-ANALOG CONVERTER AND PCM ENCODER USING THE CONVERTER

Matter enclosed in heavy brackets [ ] appears in the original patent but forms no part of this reissue specification; matter printed in italics indicates the additions made by reissue.

BACKGROUND OF THE INVENTION

The present invention relates in general to a D-A (Digital-to-Analog) converting circuit and more particularly to a PCM encoder of successive comparison type in which the D-A converting circuit is applied to a local decoder. Specifically, the present invention concerns a μ-law PCM encoder.

Remarkable progress in the field of the semiconductor technology in these years makes it possible to implement circuit elements in the form of LSI circuits with significantly improved precision and greatly enhanced performance, which in turn has motivated vigorous activity for developing LSI circuits for communication purposes with a view to realizing cheaper communication systems imparted with improved performances in the field of the communication technology.

The PCM encoder on which severe requirements are imposed in respect of the accuracy of the encoding operation has heretofore been constructed by using circuit elements or parts carefully selected and objectives for economization have been made by processing a large number of lines or channels on the basis of time-sharing multiplex techniques by using a single PCM encoder unit which is capable of operating at a high speed. However, if the PCM encoder can be implemented in the form of a LSI circuit, a so-called single channel coding system in which a PCM encoder is installed for every voice channel will become practical, since the PCM encoder device is then realized inexpensively in a small size. In this case, the PCM encoders are not required to be operated at a high speed in contrast to the prior art system where high speed is required due to the time-sharing multiplex operation. The PCM encoder is rather allowed to be operated at a relatively low speed suited for the LSI configuration to accomplish the encoding purpose.

By the way, according to the μ-law PCM encoding stipulated in Rec. G711 of CCITT (International Telegram and Telephone Consultive Committee), a voice signal has to be converted into a 8-bit code (where one bit represents the polarity of the signal) on the basis of a compressing law according to which the characteristic of $\mu=255$ is approximated with 15 segments or chords. The compressed quantizing characteristic is then such that the negative and positive polarity portions of the characteristic are divided into 8 segments or chords I, . . . , VIII, respectively, with each of the segments being divided into 16 steps, as is illustrated in FIG. 1.

In this regard, it will be noted that the first segment I is divided into 15½ steps because of the quantization of a mid-tread and differs from the other segments II, . . . , VIII in this respect, as can be seen from FIG. 2 which is a partial enlarged view of FIG. 1. Further, it is to be noted that, when two adjacent segments are concerned, the step in the segment distant from the origin is twice as large as the step in the segment or chord near the origin. Consequently, the boundary values among the individual segments of the μ-law quantizing characteristic curve are the odd numbers 31, 95, 223, 479, 991, 2015 and 4063.

The PCM encoder is generally of successive comparison type in which use is made of charge redistribution in a binary weighted capacitor array. Particularly, when the encoding according to the μ-law is to be effected, the peculiarity of the first segment in respect of the number of steps described above makes difficult the implementation of the encoder circuit. For example, in the case of a capacitor array which includes eight capacitors having capacitances in ratio of $2^0, 2^1, 2^2, \ldots 2^7$ each having one end connected in common to one input line of a voltage comparator while the other ends of the individual capacitors can be changed-over to the ground potential or a reference potential through respective switches, the output voltages derived from the capacitor array in dependence on the combinations of the change-over switches correspond to multiples of "2". Accordingly, the capacitor array used to determine the segment for the μ-law PCM encoding will not allow the boundary values in odd numbers to be derived without difficulty.

A PCM encoder of successive comparison type in which the segments are determined with the aid of a capacitor array composed of eight binary-weighted capacitors with the steps being determined by a resistor string is reported in IEEE JOURNAL OF SOLID-STATE CIRCUITS, Vol. SC-14, No. 1, Feb. 1979, pp. 65–73.

In the case of the encoder disclosed in the literature cited above, one end of each of the eight binary-weighted capacitors are connected in common to an input terminal of a comparator, while the other ends of the capacitors are adapted to be selectively connected to voltage terminals X, Y and Z through switch means. The terminal X serves as both a sample voltage input terminal and a ground potential supply terminal, the terminal Y is supplied with positive and negative reference voltages, and finally the terminal Z is supplied with step voltages derived through division of the reference voltages by the resistor string. In this encoder arrangement, the individual capacitors are first charged with the sample voltage and subsequently the switches of the capacitor array and taps for extracting the step voltages from the resistor string are successively changed over to thereby obtain a 8-bit code corresponding to the sample voltage.

The procedure heretofore adopted for effecting the encoding according to the μ-law with fidelity by using the encoder of the above-mentioned type resides in that each of the positive and negative reference voltages is divided by 32 (thirty two) through the resistor string, wherein the step voltages for the first segment are selectively derived from the odd-numbered tap voltages, i.e. the first, the third, the fifth, . . . , the twenty-ninth tap voltages of the resistor string, while the step voltages for the second to eighth segments II to VIII are derived through combinations of the 31-th tap voltage and those extracted selectively from the even-numbered taps, i.e. the second, the fourth, the sixth, . . . , the 32-th taps. This system requires a large number of taps for the resistor string circuit. Further, selection has to be made to the odd-numbered tap or even-numbered tap in dependence on which segment of the μ-characteristic curve the sample voltage in concern belongs to. As the consequence, the structure of the local decoder becomes complicated and requires a chip of a large size for implementation in LSI circuit, giving rise to a problem.

As another type of PCM encoder which follows the μ-law with fidelity, there is a proposal in Japanese Laid-Open Patent Application No. 48472/1979, for example. In the case of the PCM encoder disclosed in this literature, a unique capacitor array is used which comprises a series connection of twelve first capacitors each having a first capacity, wherein both ends of the series connection are connected to the ground potential through capacitors each having a second capacity, while both ends of each of the first capacitors are connected to respective change-over switches through thirty capacitors of the second capacity so as to be selectively connected either to a reference voltage source or to the ground potential. The output voltage of the capacitor array is compared with a sampled value of a voice signal through a comparator. In response to the results of the comparison, change-over command signals for the switch are successively produced from a local decoder, thereby to obtain a PCM code corresponding to the sampled values. However, this PCM encoder is also disadvantageous in that the capacitor array is complicated, special arithmetic operations are required for the local decoder to derive the boundary values for the individual segments I, . . . , VIII, and so forth.

SUMMARY OF THE INVENTION

Accordingly, an object of the invention is to provide a digital-to-analog or D-A converter circuit which is capable of producing an analog signal corresponding to a digital value according to the μ-law and which is suited to be implemented in a LSI circuit.

Another object of the present invention is to provide a PCM encoder which abides by the μ-law with fidelity and in which the D-A converter circuit is used as a part of a local decoder.

With a view to accomplishing the above and other objects which will become more apparent as description proceeds, there is provided according to a general feature of the present invention a digital-to-analog or D-A converter circuit which comprises a capacitor array circuitry composed of first to eighth capacitors with binary-weighted capacitance ratio and having one end of each of these capacitors connected in common to an output line, a first common line of a first potential connected to the other ends of the first to eighth capacitors through a first group of switches, a second common line of a second potential connected to the other ends of the first to the seventh capacitors through a second group of switches and a third common line connected to the other ends of the first to the eighth capacitors through a third group of switches, a resistor string forming a resistance element connected between the second common line and the first potential, sixteen taps for extracting voltages which correspond to $2n-1)/33$ (where $n=1, \ldots, 16$) of a voltage appearing across the resistance element, and a fourth group of switches inserted between the individual taps and the third common line, and a logic circuit for controlling selectively the switching operations of the first to the fourth groups of the switches in dependence on a digital signal to be converted, wherein an analog signal corresponding to the digital signal is produced from the output line.

In a preferred embodiment of the present invention, the logic circuit stated above comprises first logic circuitry for controlling the switching operation of each of the first to the third groups of switches and second logic circuitry for controlling the switching operation of the fourth groups of switches, wherein the first logic circuitry is adapted to output signals for controlling the associated switches in dependence on the values of the second to eighth bits of a 8-bit digital signal in which a first bit serves as a polarity bit, while the second logic circuitry is adapted to produce the switch control signals in dependence of the values of the fifth to the eighth bits of the digital signal.

According to another feature of the invention, the D-A converter circuit described above is used as a part of a local decoder in combination with a voltage comparator to thereby attain a PCM encoder which conforms to the μ-law with a high fidelity.

In this case, a switch circuit is provided in such an arrangement that the first common line is supplied with a sampling signal at the beginning of each coding period to thereby charge the individual capacitors and is subsequently supplied with the first potential, while another switch circuit is provided which is capable of supplying selectively to the second common line the reference voltage of positive or negative polarity in dependence on the first output signal from the voltage comparator.

In a preferred embodiment of the invention, the switching control for the first to the fourth groups of switches is effected by a successive approximation register circuit.

The foregoing and other objects, advantages, manner of operation and novel features of the present invention will be understood from the following detailed description when read in connection with the accompanying drawings.

BRIEF DESCRIPTION OF THE DRAWINGS

FIG. 5 illustrates logic functions of a logic circuit (31) shown in FIG. 4.

FIG. 6 is a view similar to FIG. 5 but for another logic circuit (21) shown in FIG. 4.

DESCRIPTION OF THE PREFERRED EMBODIMENTS

Figure 1:
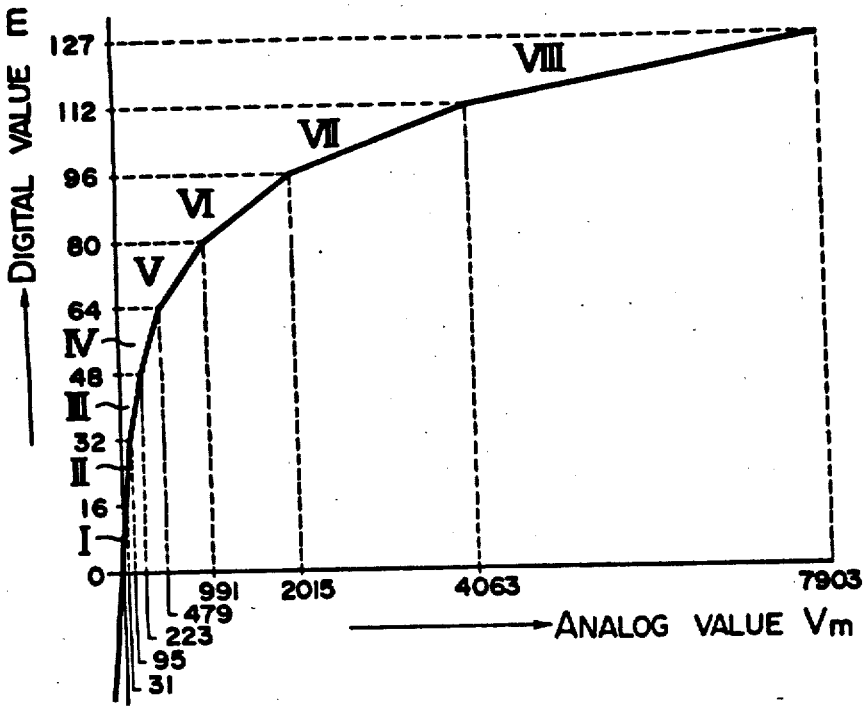
FIG. 1 illustrates the positive polarity portion of a compressed quantizing characteristic curve of 15 segments ($\mu=255$).

In the following, exemplary embodiments of the present invention will be described in detail by referring to the drawings.

Figure 3:
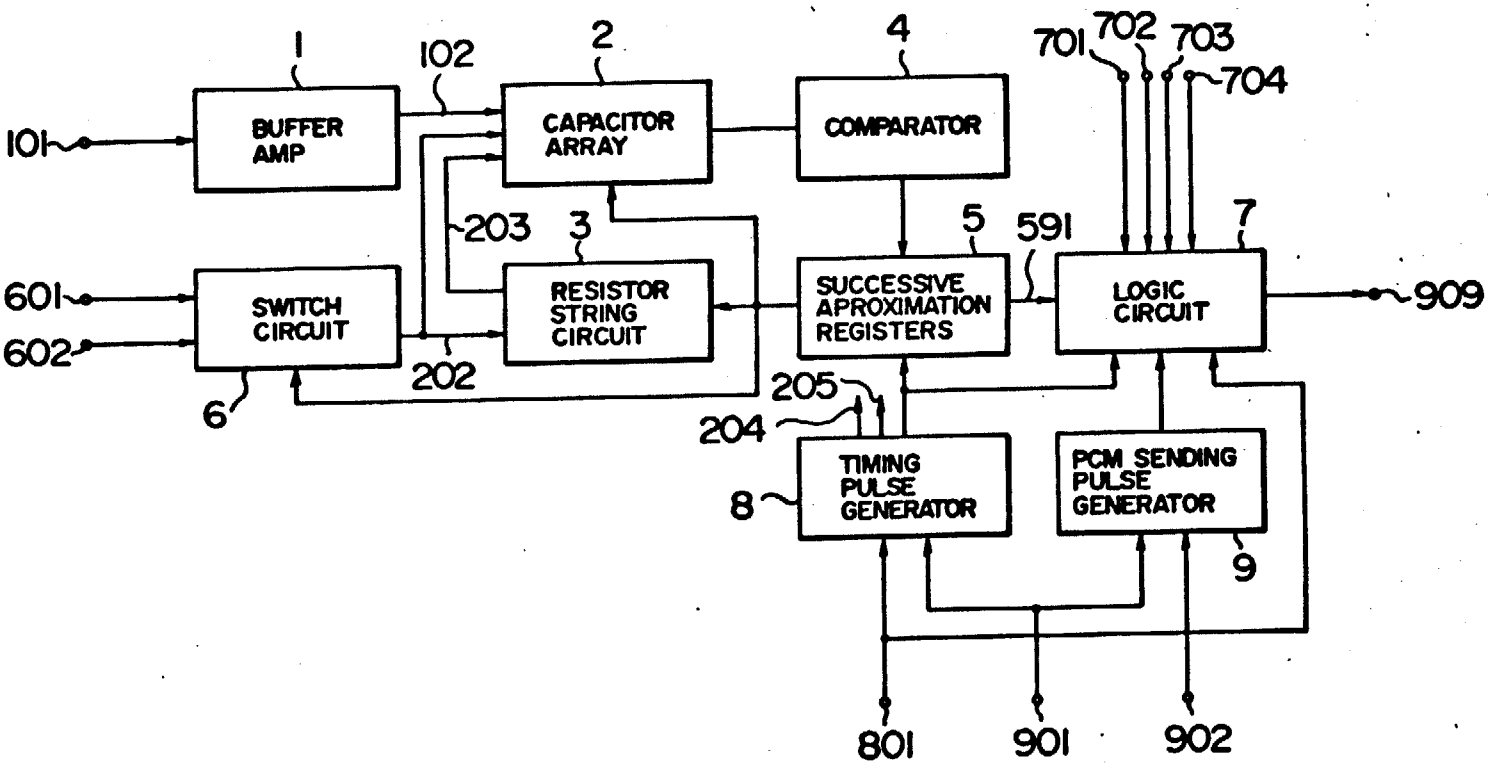
FIG. 3 is a block diagram to show a general arrangement of a PCM encoder according to an embodiment of the invention.

FIG. 3 shows schematically a general arrangement of a PCM encoder in which a digital-to-analog or D-A converter circuit according to the invention is applied to a local decoder circuit.

In FIG. 3, reference numeral 1 denotes a buffer amplifier designed to provide impedance conversion, and numeral 2 designates generally a capacitor array for producing voltages representative of nodes of eight segments of positive and negative polarities as well as the inclinations of the individual segments or chords in accordance with the μ-law encoding. Numeral 3 denotes a resistor string circuit for producing uniform step voltages within the individual segments, numeral 4 denotes a voltage comparator, 6 denotes a switch circuit for changing over the polarity of positive and negative reference voltages applied to terminals 601 and 602 from a reference voltage source, 5 denotes a successive approximation register circuit which is supplied with a digital signal from the comparator 4 and produces pulses for driving analog switches provided in the circuits 2, 3 and 6, and numeral 7 denotes a logic circuit which is adapted to send out a PCM signal from a terminal 909 with a required bit rate at a predetermined time. Further, reference numeral 8 denotes a logic circuit for producing a timing pulse signal for the encoding operation on the basis of a basic clock pulse signal for A-D conversion supplied from a signal line 801 and a frame synchronous pulse signal supplied from a terminal 901. Numeral 9 denotes a logic circuit for generating a PCM sending pulse signal on the basis of the frame synchronous pulse signal and a transmission timing pulse signal supplied from a signal line 902. An input voice signal is applied to a terminal 101 and supplied to an input line 102 which extends to the capacitor array circuit 2 through the buffer amplifier 1. The PCM code which undergoes the A-D conversion is supplied to the input of the logic circuit 7 by way of a signal line 591. The logic circuit 7 is also supplied with signaling frame pulses (A/B SEL) externally through signal lines 701, 702 and 703 and additionally supplied from a signal line 704 with a control signal which commands the all zero code suppression, as will be described in more detail hereinafter.

Figure 4:
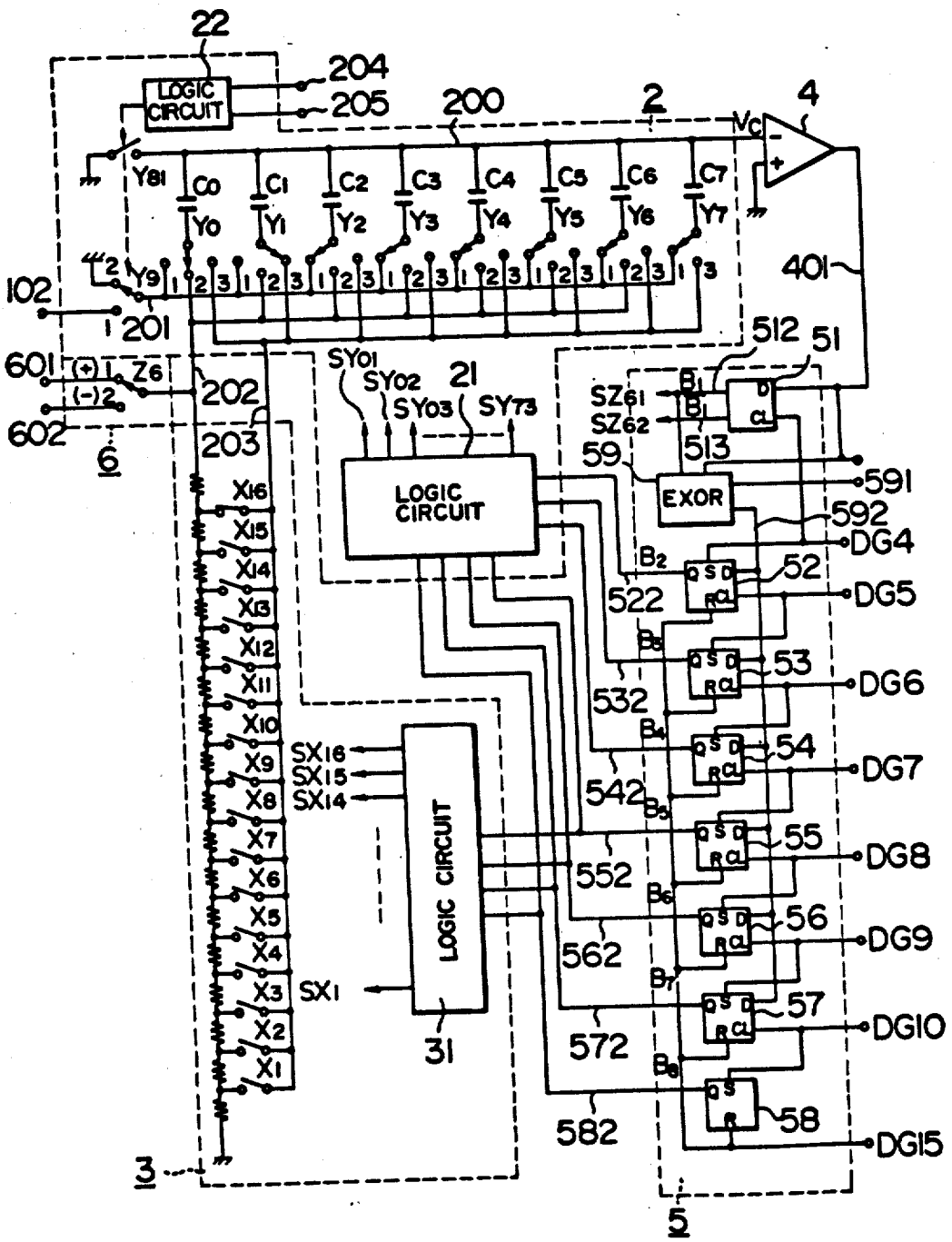
FIG. 4 shows in detail a circuit arrangement for the blocks (2, 3, 5 and 6) shown in FIG. 3.

FIG. 4 shows more specifically an exemplary circuit arrangement of the circuits 2 to 6 shown in FIG. 3.

The capacitor array circuit 2 includes eight capacitors $C_0, \ldots, C_7$ having capacitance values in ratio of $2^0, 2^1, 2^2, \ldots, 2^7$. The one electrode of each of these capacitors is connected in common to an output line 200 which has one end connected to an inverted input terminal of the voltage comparator 4. The other end of the output line 200 is selectively connected to the ground potential through a reset switch $Y_{81}$. The non-inverted input terminal of the voltage comparator 4 is also at the ground potential.

The other electrodes of the capacitors $C_0$ to $C_6$ are adapted to be selectively connected to three common lines 201, 202 and 203 through respective switch contacts. The other electrode of the capacitor $C_7$ is selectively connected to the two common lines 201 and 203 through respective switch contacts. For convenience's sake, it is assumed that the switches or switch contacts mentioned above are denoted by $Y_{nm}$ where n represents the positions of the associated capacitors and is an arbitrary one of 0 to 7, while m represents the least significant digit of the reference numerals 201, 202 and 203 attached to the common lines and is any given one of 1 to 3. For example, it can thus be said that the capacitor $C_4$ is adapted to be selectively connected to the common lines 201, 202 and 203 through the switches or switch contacts $Y_{41}$, $Y_{42}$ and $Y_{43}$, respectively.

The common line 201 is connected through a switch contact $Y_{91}$ to the input line 102 for the sample voice signal and can be grounded through a switch contact $Y_{92}$. The common line 202 is adapted to be selectively connected through switch contacts $Z_{61}$ and $Z_{62}$ to terminals 601 and 602 to which the reference voltages of positive and negative polarities are applied, respectively. Further, the common line 203 is connected through switches to taps of the resistor string circuit 3 for taking out the divided voltages in the manner described hereinafter.

The sampling and holding switch $Y_{91}$; $Y_{92}$ as well as the reset switch $Y_{81}$ are controlled by an output signal from a logic circuit 22 which is adapted to generate the switch control signal in response to a set signal 204 and a reset signal 205 which are produced by the pulse generator circuit 8.

The resistor string circuit 3 includes sixteen taps, a single resistor string having the lowermost end coupled to the ground potential and the uppermost end connected to the common line 202, and sixteen switches $X_n$ (where n is any given number of 1 to 16) connected to the taps, respectively, at one end thereof. All the other ends of these switches $X_n$ are connected to the common line 203. Thus, a tap voltage $2n-1$ can be taken out to the common line 203 when a corresponding one of the switches $X_n$ is closed. In this connection, it is to be noted that the reference voltage applied to the uppermost end or the common line 202 has an absolute value of 33. In other words, the resistor part which is located nearest to the grounded end of the resistor string has a resistance value which is equal to a half of the resistance value of each of the other sixteen resistors.

The successive approximation registor circuit 5 includes delayed-type flip-flops or the like logic circuits 51 to 57 (hereinafter referred to as D-flip-flop), a set-reset flip-flop 58 (hereinafter referred to as RS-flip-flop) and an exclusive-OR gate (EXOR) 59. Among the flip-flops, those 52 and 57 are imparted with the set and reset functions.

The output line 401 of the voltage comparator 4 is connected to a data input terminal D of the flip-flop 51 and to one input terminal of the exclusive-OR (EXOR) gate 59. The flip-flop 51 has two output lines 512 and 513 at which logic levels complementary to each other appear, respectively. The output line 512 is adapted to produce a control signal $SZ_{61}$ commanding the reference voltage change-over switch $Z_6$ to be closed to the terminal 601, while the output line 513 produces a control signal $SZ_{62}$ commanding the switch $Z_6$ to be closed to the terminal 602. The output line 512 is connected to the other input terminal of EXOR 59 which has two output lines 591 and 592 at which two logic levels complementary to each other appear, respectively. The output line 591 is connected to the logic circuit 7 described hereinafter, while the output line 592 (on which the negated output of the signal on the line 591 appears) is connected to each of the data input terminals of the flip-flops 52 to 57. A signal DG4 is applied to a data clock terminal CL of the flip-flop 51 and a set terminal S of the flip-flop 52. A signal DG5 is applied to a data clock terminal CL of the flip-flop 52 and to a set terminal S of the flip-flop 53. A signal DG6 is applied to a data clock terminal CL of the flip-flop 53 and to a set terminal S of the flip-flop 54. A signal DG7 is applied to a data clock terminal CL of the flip-flop 54 and a set terminal S of the flip-flop 55. A signal DG8 is applied to a data clock terminal CL of the flip-flop 55 and to a set terminal S of the flip-flop 56. A signal DG9 is applied to a data clock terminal CL of the flip-flop 56 and to a set terminal S of the flip-flop 57. A signal DG10 is applied to a data clock terminal CL of the flip-flop 57 and to a set terminal S of the flip-flop 58. A signal DG15 is applied to the reset terminals R of the flip-flops 52, 53, . . . , 58, respectively. The signals DG4, DG5, . . . , DG15 mentioned above are generated by the pulse generator circuit 8.

The logic circuit 21 is adapted to produce pulses ($SY_{01}$, $SY_{02}$, . . . , $SY_{71}$, $SY_{73}$) for controlling the switching operations of the switches $Y_{nm}$ disposed in the capacitor array circuit 2 in dependence on the logic outputs ($B_2$, $B_3$, $B_4$, $B_5$, $B_6$, $B_7$ and $B_8$) appearing at output lines 522 to 582 of the flip-flops 52 to 58 constituting the successive approximation register circuit described hereinbefore.

On the other hand, a logic circuit 31 is adapted to generate pulses ($SX_1$, $SX_2$, . . . , $SX_{16}$) for controlling the on-off operations of the switches X connected in the resistor string circuit 3 in dependence on the logic outputs ($B_5$, $B_6$, $B_7$ and $B_8$) produced from the flip-flop 55, 56, 57 and 58.

FIG. 5 illustrates the relationships between the logic levels of the input signal to the logic circuit 31 and the corresponding switches which are closed or turned on. In this figure, $B_5$, $B_6$, $B_7$ and $B_8$ represent, respectively, the logic states at the output lines 552, 562, 572 and 582 of the flip-flops 55, 56, 57 and 58 shown in FIG. 4. By way of example, when $B_5$, $B_6$, $B_7$ and $B_8$ are logic "0", "1", "0" and "1", respectively, the switch $X_5$ is selected, whereby there appears at the common line 203 an output voltage of (9/33), $V_{REF}$ where $V_{REF}$ represents the value of the reference voltage applied to the terminal 601 or 602.

FIG. 6 illustrates the relationships among the logic level of the input to the logic circuit 21, the corresponding switches which are turned on and the output voltages from the local decoder, which voltage constitutes the input to the comparator. In this figure, $B_2$, $B_3$, . . . , $B_8$ represents, respectively, the logic levels at the output lines 522, 532, 542, 552, 562, 572 and 582 of the flip-flops 52, 53, . . . , 58. Further, ($B_5+B_6+B_7+B_8$) represents a logical sum of $B_5$, $B_6$, $B_7$ and $B_8$. It can be seen that when the logical sum ($B_5+B_6+B_7+B_8$) is logic "0" and $B_2$, $B_3$ and $B_4$ are all logic "0's", all the flip-flops 52, . . . , 58 are in the reset state with all the switches or switch contacts $Y_{n1}$ (where n represents a given one of 0 to 7 ) being turned on. This result in the output of zero volt from the local decoder. However, when $B_2$, $B_3$ and $B_4$ are all logic "0's" and the logical sum ($B_5+B_6+B_7+B_8$) is logic "1", then the switches $Y_{03}$ and $Y_{n1}$ (where n represents a given one of 1 to 7) are closed or ON, as the result of which the output voltage from the local decoder is one selected from a range of $[1/(255\times33)].V_{REF}$ to $[29/(255\times33)].V_{REF}$ in dependence on combinations of $B_5$, $B_6$, $B_7$ and $B_8$. More particularly, it is assumed that $B_5$, $B_6$, $B_7$ and $B_8$ are all logic "0's". Under the condition, when $B_2$, $B_3$ and $B_4$ are all logic "0's", the lowermost voltage of the first segment I shown in FIG. 1 is produced. When $B_2$, $B_3$ and $B_4$ are logic "0", "0" and "1", respectively, i.e. "0, 0, 1", the lowermost voltage of the second segment II which is given by $[31/(255\times33)].V_{REF}$ is produced. When "$B_2$, $B_3$, $B_4$" are logic "0, 1, 0", the lowermost voltage of the third segment III which is given by $[95/(255\times33)].V_{REF}$ is produced. In the similar manner, when "$B_2$, $B_3$, $B_4$" are logic "1, 1, 1", the lowermost voltage $[(4063/(255\times33)].V_{REF}$ of the eighth segment VIII is produced. When "$B_2$, $B_3$, $B_4$, $B_5$, $B_6$, $B_7$, $B_8$" are "1, 1, 1, 1, 1, 1, 1", then the upper most voltage of $[7903/(255\times33)].V_{REF}$ of the eighth segment VIII is produced.

Next, the principle of operation of the encoder according to the invention will be described by referring to a signal timing diagram shown in FIG. 7.

When the encoder is to be used as a single channel coding device for voice frequency signals such as carried by a telephone or the like, the encoding period is usually 125 μs (corresponding to 8 KHz in frequency). According to the invention, the basic clock pulse 801 having a frequency of 128 KHz is supplied to the input of the control pulse generator circuit 8, whereby the encoding of a sampled signal is accomplished within an input period ($t_0$ to $t_{15}$) which corresponds to sixteen basic clock pulses. The control pulse signals 204, 205 and DG4 and DG15 are also produced by the control pulse generator circuit 8 in synchronism with the basic clock pulse.

Figure 7:
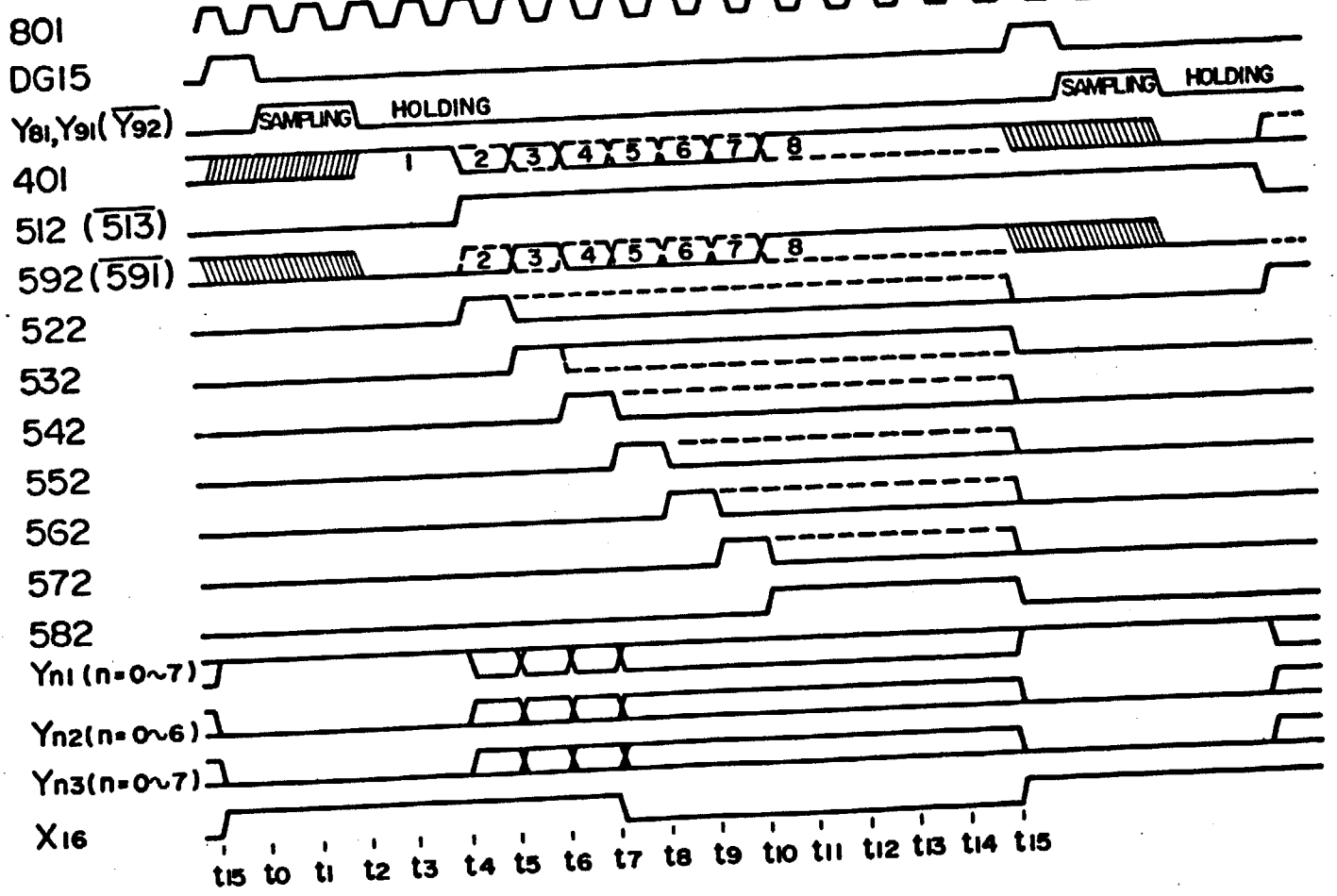
FIG. 7 shows a signal time chart to illustrate operations of the circuit shown in FIG. 4.

In the case of the example illustrated in FIG. 7, it is assumed that the output levels of all the flip-flops shown in FIG. 4 vary in synchronism with the leading edges of the input data clock pulse, reset pulse and set pulse.

At a time point $t_{15}$, all the flip-flops 52 to 58 are reset by the reset pulse DG15, resulting in that the logical output levels "$B_2$, $B_3$, $B_4$, $B_5$, $B_6$, $B_7$, $B_8$" are "0, 0, 0, 0, 0, 0, 0". Under the condition, the switches $Y_{n1}$ (where n is a given one of 0 to 7) and $X_{16}$ are turned on. At a time point to, the control signals 204 and 205 are applied to the logic circuit 22, so that the switches $Y_{81}$ and $Y_{91}$ are turned on. Consequently, the voice signal voltage (VIN) applied to the terminal 102 is charged in the capacitors $C_0$, $C_1$, . . . , $C_7$, whereby the sampling is effected. Subsequently, at a time point $t_2$, the switches $Y_{81}$ and $Y_{91}$ are turned off, while the switch $Y_{92}$ is turned on, whereby the preceding sampling voltages are inverted in polarity and held in this state. In other words, the inverted input voltage Vc to the comparator 4 is equal to $-V_{IN}$. For simplification of description, it is assumed that the voltage $V_{IN}$ is a value between $+[103/(255\times33)].V_{REF}$ and $[111/(255\times33)].V_{REF}$. Then, the compartor 4 produces the signal $B_1$ of the logic level (logic "1" under the assumption) corresponding to the polarity of the input signal after an inherent time delay. Upon application of the pulse DG4 having logic level "1" during a time span between the time points $t_4$ and $t_5$, the output of logic "1" from the comparator 4 is read in the flip-flop 51, resulting in that the output $SZ_{61}$ on the signal line 512 corresponds to "$B_1$" of logic "1", while the output $SZ_{62}$ on the signal line 513 corresponds to "$B_1$" of logic "0" level. As the consequence, the reference voltage change-over switch $Z_{61}$ is turned on, resulting in that the reference voltage $+V_{REF}$ makes appearance on the common line 202, while a voltage of $+(31/33).V_{REF}$ is produced on the common line 203. At the same time, a signal $B_2$ of logic "1" is produced on the output line 522, because the flip-flop 52 is set by the pulse DG4. Thus, the switches (or switch contacts) $Y_{02}$, $Y_{12}$, $Y_{22}$, $Y_{33}$, $Y_{41}$, $Y_{51}$, $Y_{61}$, $Y_{71}$ and $X_{16}$ are closed, as can be seen from FIGS. 5 and 6. As the consequence, the voltage $V_C$ applied to the comparator 4 is given by $-V_{IN}+[479/(255\times33)].V_{REF}$ volts. In this case, the second bit of the output from the comparator 4 is "0".

Subsequently, upon application of the pulse DG5 of logic "1" during a period ($t_5$ to $t_6$), the data input lines 592 to the flip-flops 52, . . . , 57 are at logic "0" due to negation of the exclusive OR by the first bit. Under the condition, since the pulse DG4 is simultaneously logic "0", the logical level $B_2$ of "0" appears on the output line 522 of the flip-flop 52, while a logical level $B_3$ of "1" is produced on the output line 532 of the flip-flop 53. In this way, the state in which logical levels "$B_2$, $B_3$, $B_4$, $B_5$, $B_6$, $B_7$, $B_8$" are "0, 1, 0, 0, 0, 0, 0" is established. Accordingly, the switches $Y_{02}$, $Y_{13}$, $Y_{21}$, $Y_{31}$, $Y_{41}$, $Y_{51}$, $Y_{61}$, $Y_{71}$ and $X_{16}$ are closed (ON) in accordance with the logic conditions illustrated in FIGS. 5 and 6. The input voltage Vc to the voltage comparator 4 is thus varied to $-V_{IN}+[95/(255\times33)].V_{REF}$ volts, resulting in that the output signal from the comparator 4 has the third bit of logic "1".

In a similar manner, the pulse DG6 is applied at a time point $t_6$ to establish the logical state in which "$B_2$, $B_3$, $B_4$, $B_5$, $B_6$, $B_7$, $B_8$" are "0, 1, 1, 0, 0, 0, 0" and hence the switches $Y_{02}$, $Y_{12}$, $Y_{23}$, $Y_{31}$, $Y_{41}$, $Y_{51}$, $Y_{61}$, $Y_{71}$ and $X_{16}$ are turned on. The comparator input voltage Vc is then equal to $-V_{IN}+[223/(255\times33)].V_{REF}$ volts, resulting in the comparator output signal having the fourth bit of logic "0". At a time point $t_7$, the pulse DG7 is applied, whereby the logic state of "0, 1, 0, 1, 0, 0, 0" is established, resulting in that the same Y switches as mentioned just above and the switch $X_8$ are turned on. The input voltage Vc to the comparator 4 is then equal to $-V_{IN}+[159/(225\times33)].V_{REF}$ volts. The output signal from the comparator 4 has thus the fifth bit of "0". At a time point $t_8$, in response to the application of pulse DG8, the logical state of "0, 1, 0, 0, 1, 0, 0" is established, whereby the switch $X_4$ is now turned on with the switches Y remaining unchanged. The input voltage Vc to the comparator is then $-V_{IN}[127/(255\times33)].V_{REF}$ volts, resulting in that the sixth bit of the output from the comparator is logic "0". At a time point $t_9$, in response to the application of pulse DG9, the logical state of "0, 1, 0, 0, 0, 1, 0" is established. The switch $X_2$ is then turned on with the states of the switches Y remaining unchanged. Thus, $VC=-V_{IN}+[111/(255\times33)].V_{REF}$ volts. The seventh bit of the comparator output is then logic "0". Finally, when the pulse DG10 is applied at a time point $t_{10}$, the logical levels "$B_2$, $B_3$, $B_4$, $B_5$, $B_6$, $B_7$, $B_8$" are "0, 1, 0, 0, 0, 0, 1" with the result that the switch $X_1$ is closed with the switches Y being unchanged. Therefore, $Vc=-V_{IN}+[103/(255\times33)].V_{REF}$. The eighth bit of the output from the voltage comparator is then logic "1".

In this way, one cycle of A-D conversion of 8 bits has been completed. In this connection, it should be recalled that the output from the comparator 4 is produced with a certain time delay with reference to the application of the voltage produced from the capacitor array. The amount of the time delay depends on the positive or negative amplitude of the applied voltage. Generally, the time delay becomes greater, as the amplitude becomes smaller. Accordingly, a sufficient time margin is required in consideration of the time delay of the comparator in order to assure that the individual flip-flops of the successive approximation register circuit are set to certain states and subsequently the results of comparisons effected by the comparator are again read into these flip-flops. Unless such time margin is adequate, a signal-to-quantizing noise characteristic will be deteriorated particularly for the signal of a small amplitude. However, since the time required for performing the one cycle of A-D conversion is limited, it will be impossible to allot a sufficient time to all the comparisons. Such being the circumstances, the invention teaches that a lengthened time is allotted to a period in which the probability of the comparisons of small amplitude signals being performed with the highest frequency is highest, to thereby assure the accurate voltage comparison. More specifically, the comparisons for the first bit (polarity bit) and the eighth bit are alloted with a time duration twice as long as the time assigned to the comparison for the other bits.

Next, a circuit arrangement as well as operation of the logic circuit 7 for deriving an actual PCM transmission signal from the signal obtained from the A-D conversion will be described.

Figure 10:
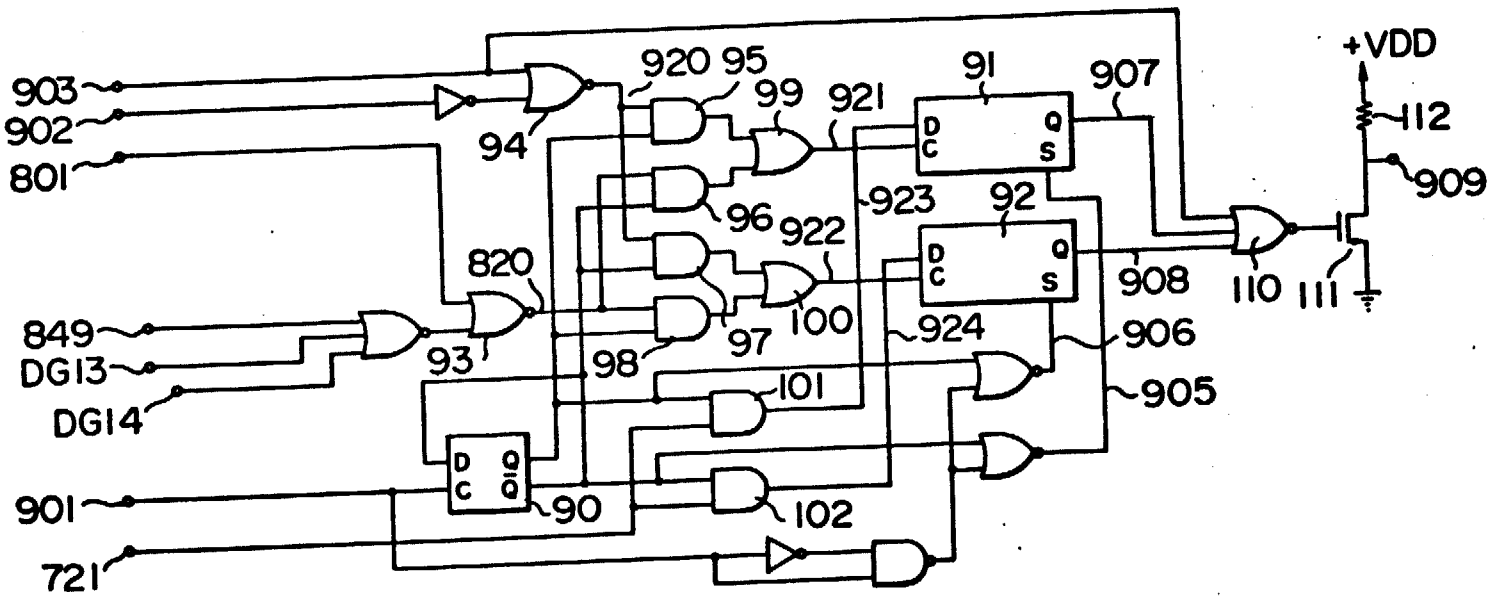
FIG. 10 shows another part of the circuit of the block (7) shown in FIG. 3.

The logic circuit 7 is composed of circuitry for effecting insertion of signals A and B and suppression of the all-zero code (shown in FIG. 8) and a circuitry for sending out the thus processed PCM code from an output terminal 909 with a proper timing (shown in FIG. 10).

Figure 8:
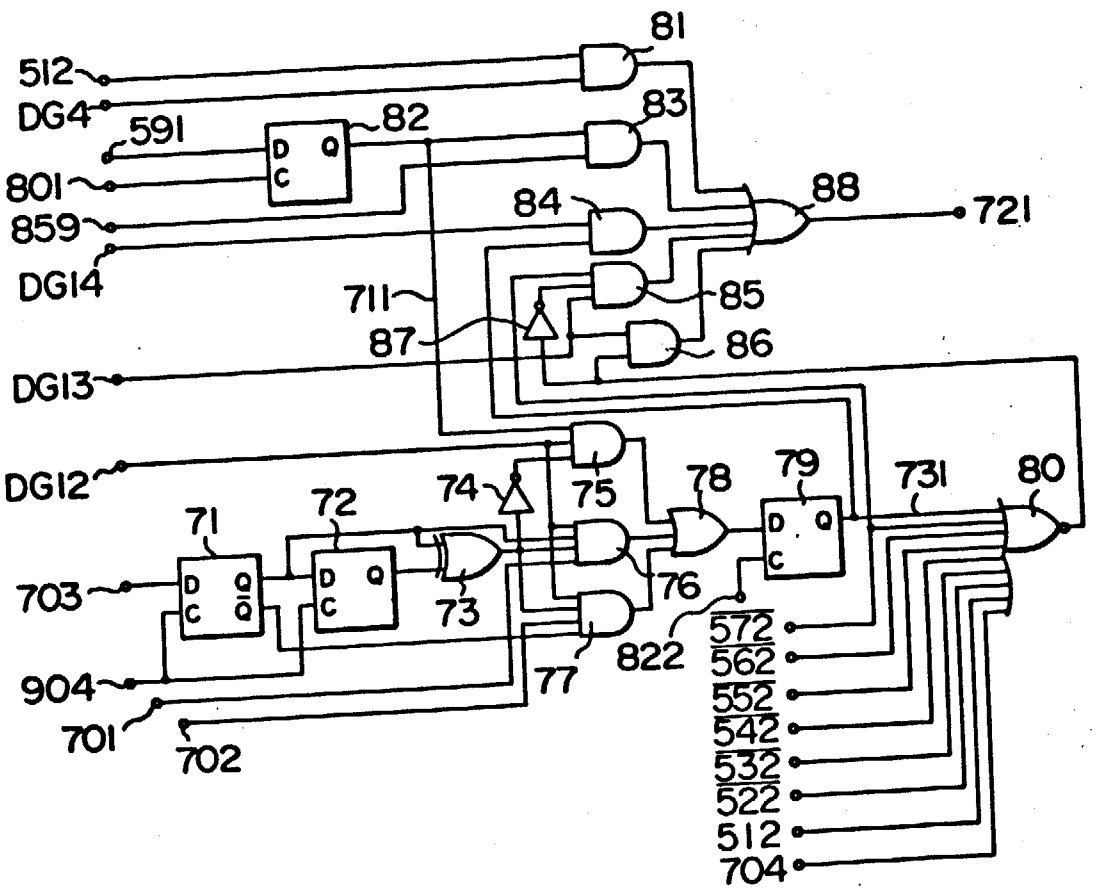
FIG. 8 shows in detail a part of a circuit arrangement of the block (7) shown in FIG. 3.
Figure 9:
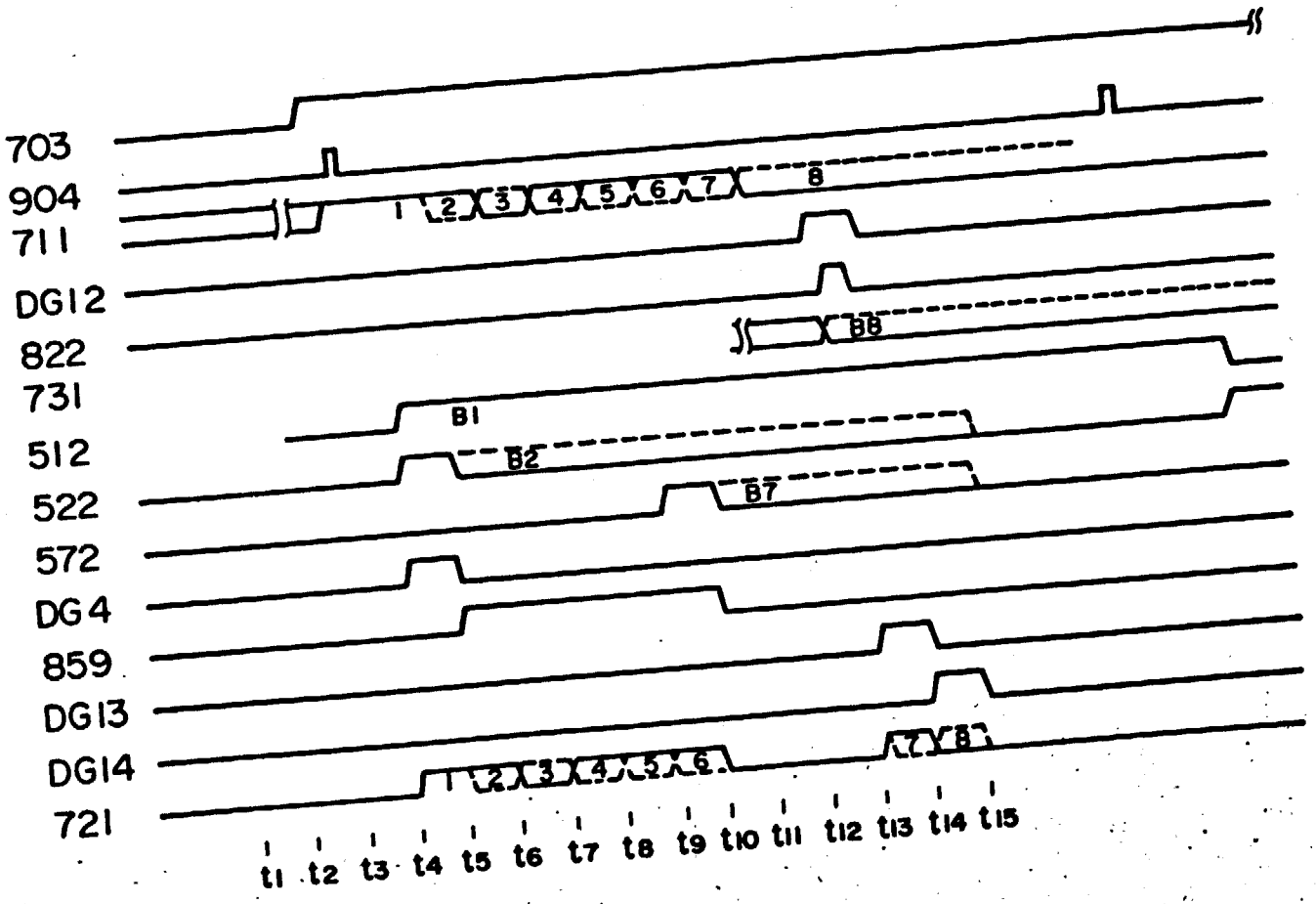
FIG. 9 is a signal time chart to illustrate operations of the circuit shown in FIG. 8.

In the first place, the circuit shown in FIG. 8 will be elucidated by referring to FIG. 9 which shows a signal waveform diagram.

Figure 2:
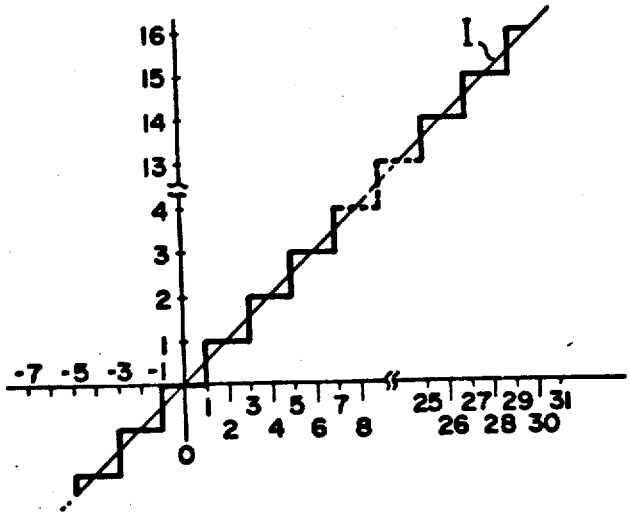
FIG. 2 is an enlarged partial view of FIG. 1 to illustrate a first segment 1 of the characteristic curve.

The circuitry shown in FIG. 8 serves for sending the signals such as dial pulses, supervisory pulses or the like by inserting signal A at the eighth bit of the sixth frame, inserting signal B at the eighth bit position of the twelfth frame and inserting "1" at the seventh bit position of every frame for the all-zero code. In FIG. 8, reference numerals 71, 72, 79 and 82 denote D-type or the like flip-flops similar to or the same as those used in the circuit shown in FIG. 2, 73 denotes an exclusive-OR gate, 74 and 87 denote inverters, 75, 76, 77, 81, 83, 84, 85 and 86 denote AND gates, 78 and 88 denote OR gates, and 80 denotes a NOR gate. The signal A is applied to a signal line 701, while the signal B is applied to a signal line 702. A signal line 703 is supplied with a A/B select signal. For the A/B select signal, a pulse is used which has a leading edge occurring before the determination of the eighth bit in the A-D conversion of the fifth frame and a trailing edge occurring before the determination of the eighth bit in A-D conversion of the eleventh frame. A signal line 904 is supplied with a pulse at a time delayed slightly relative to the leading or trailing edge of the pulse applied to the signal line 703. The pulse applied to the signal line 904 has a leading edge for every frame and serves for timing the pulses applied to the signal line 703. On the other hand, the output pulse signal 591 obtained from the successive approximation circuit 5 described hereinbefore is timed by the basic clock pulse 801 for the A-D conversion through the flip-flop 82 and appears on a signal line 711. Since the pulse train on the signal line 711 bears such relationship to the pulse signal DG12 as illustrated in FIG. 9, there appears at the output of the OR gate 78 the logical level of the signal A derived from the AND gate 76 during a time span between $t_{12}$ and $t_{13}$ in the fifth frame, the logical level of the signal B from the AND gate 77 during a time span between $t_{12}$ and $t_{13}$ in the eleventh frame, and the A-D converted signal of voice, i.e. the logical level of the eighth bit on the signal line 711 during time spans between $t_{12}$ and $t_{13}$ in the first to fourth frames, the sixth to tenth frames and the twelfth frame, respectively.

Each of these outputs from the gate 78 is latched by the flip-flop 79 for a time corresponding to the single frame with the aid of the pulse 822 and then output to the signal line 731.

In the meanwhile, there appear on the output line 721 of the gate 88 through the gates 81 and 83 the first bit during a time span between $t_4$ and $t_5$ and the second to the sixth bits during a period from $t_5$ to $t_{10}$.

The result of decision as to whether the bits of the PCM signal to be sent out for every frame are all zero or not is indicated by the logical level of the output signal from the gate 80 at the time point $t_{13}$. More specifically, at the time point $t_{13}$, the logical levels of the first to the second bits of the PCM code are held at the output lines of the flip-flops 51 to 57 included in the successive approximation register circuit 5 while the logical level of the eighth bit of the same PCM code is held at the output line 731 of the flip-flop 79. Accordingly, when all of these bits are logic "0's", the output signal from the gate 80 is logic "1", resulting in that the signal on the output line 721 is logic "1" during a period from $t_{13}$ to $t_{14}$. On the other hand, when any one of the bits mentioned above is logic "1", then the logical level of $\overline{572}$ is produced as it is to the output line 721. In this case, the output level of the flip-flop 79 is delivered as the eighth bit during a time span between $T_{14}$ and $t_{15}$. It should be added that the other signal line 704 of the gate 80 is provided to selectively determine whether the all zero code suppression is to be effected or not. More particularly, when the signal line 704 is at the logical level "1", then the suppression of the all-zero code is not effected.

Figure 11:
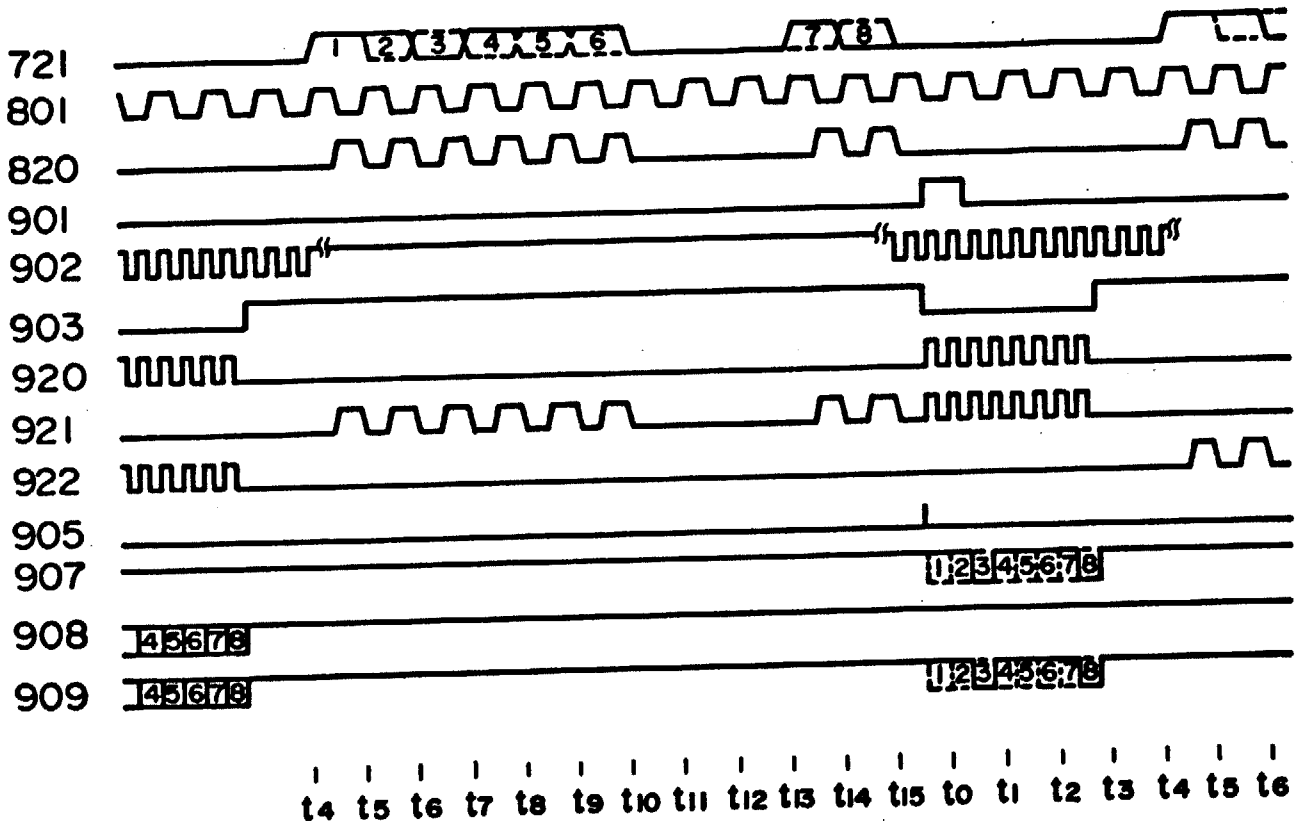
FIG. 11 is a signal time chart to illustrate operations of the circuit shown in FIG. 10.

FIG. 10 shows a logic circuit for sending out with a proper timing from the output terminal of the encoder the PCM signal which has undergone the signaling processing and the all-zero-code-suppression processing in the manner described above. FIG. 11 illustrates operations of the circuit shown in FIG. 10 on the time base. In FIG. 10, reference numeral 90 denotes a D-type or the like flip-flop, and 91 and 92 denote serial-in, serial out shift registers with set function. Other logical gates are the same as those shown in FIG. 8.

From the basic clock signal 801 for the A-D conversion, the pulse signal 849 having logical level "1" during a period from $t_4$ to $t_{10}$ and the pulse signals DG13 and DG14 having logical level "1" during time spans between $t_{13}$ and $t_{14}$ and between $t_{14}$ and $t_{15}$, respectively, a read-in pulse signal 820 having pulses corresponding to the individual bit positions of a PCM pulse train 721 is produced through the gate 93, as is illustrated in FIG. 11. Further, read-out pulses designated by 920 are derived at the output of the gate 94 from a pulse signal 902 which in turn is derived from the timing pulse for the PCM transmission and a pulse signal 903 produced from the frame synchronous pulse 901 by the logic circuit 9. On the other hand, there are obtained at the outputs Q and $\overline{Q}$ of the flip-flop 90 which is changed over in the state in response to the frame synchronous signal 901 the pulses which alternate between the logic "1" and "0" for every frame. Accordingly, a pulse train in which the read-in pulse 820 and the read-out pulse 920 alternate with each other for every frame can be obtained on the output signal lines 921 and 922 of the OR gates 99 and 100, respectively, through the AND gates 95 to 98 which are controlled by the outputs Q and $\overline{Q}$.

At that time, the shift registers 91 and 92 receive at the respective data input lines 923 and 924 the PCM pulse train in which the logical levels "1" and "0" alternate with each other for every frame through the AND gates 101 and 102 controlled by the output signal from the flip-flop 90 described above. As a consequence, the read-in of the PCM pulse train for a certain frame (e.g. frame of number n−1) is followed by the read-out of the PCM pulse train for the succeeding frame (frame number of n) through the shift register 91. On the other hand, in the shift register 92, the PCM pulse train is read in during the frame (n) and read out during the succeeding frame (N+1). In this manner, the PCM signals read out from the shift registers 91 and 92 can be sent out through the output gate circuit 110 in synchronism with the frame synchronous pulse signal 901 and the transmission timing pulse signal 902 without incurring mutual interference. The output signal from the output gate 110 is applied to the gate electrode of an output transistor 111, as the result of which a PCM pulse signal having an amplitude corresponding to a difference between the voltage at the source electrode of the output transistor 94 and a source voltage $V_{DD}$ supplied through a load resistor 112 is sent out from the output terminal 909.

In the case of the circuit configuration shown in FIG. 10, a third input pulse signal 903 to the output gate 110 is used for the control with a view to realizing the time-sharing multiplex. PCM transmission with the aid of only the wired OR.

According to the prior art, the output terminals of the individual encoders are constituted by open drains or open collectors which are connected in parallel with one another in the same number as that of the time-sharing multiplexings and connected to a single resistance element serving as the load resistor, in order to realize the wired OR. In this case, a single externally attached resistor will be sufficient regardless of the number of the time-sharing multiplexings. However, the resistance value of the resistor has to be selected in dependence on the number of time-sharing multiplex in order to improve the rise-up characteristic of the pulse signal.

On the contrary, according to the circuit configuration shown in FIG. 10, the individual encoders contain respective load resistors 112 each having a preset value, which involves an advantage that the outputs of the encoders may simply be connected in parallel in the same number as that of the time-sharing multiplexings. The resistance value R of the load resistor 112 can be determined in accordance with the following expression:

$$R = \frac{n \cdot tr}{2.2\,(nC_0 + C_1)} \qquad (1)$$

where $$tr = 2.2\,\tau \qquad (2)$$

and n: number of multiplexings (the number of the single channel encoders connected in parallel), $C_0$: a capacitance value of the single channel encoder as observed from the output terminal, $C_1$: value of stray capacity as added due to the multiplexing (parallel connections), $\tau$: time constant determined by values of capacity and resistance, tr: rise-up time of a pulse required in view of the characteristic of the encoder.

In general, since $n\,C_0 >> C_1$, the expression (1) may be rewritten into $R = tr/2.2\,C_0$ which is apparently independent from the number of time-sharing multiplexings (or parallel connections).

In the case where the rise-up time of PCM pulse should be much shortened for some reason, this can be easily accomplished by using an externally attached resistor.

I claim:

1. A digital-to-analog converter comprising:

a capacitor array circuit including first to eighth capacitors having binary-weighted capacities in ratio, each capacitor having one end thereof connected to an output line, a first common line of a first potential connected to the other ends of said first to eighth capacitors through respective switch contacts of a first switch group, a second common line of a second potential connected to the other ends of said first to seventh capacitors through respective switch contacts of a second switch group, and a third common line connected to the other ends of said first to eighth capacitors through respective switch contacts of a third switch group;

a resistor string circuit including a resistance element connected between said second common line and a source of said first potential, sixteen taps connected to said resistance element at respective points for deriving voltages which correspond to $(2n-1)/33$ (where n represents a given number of 1 to 16) of a voltage applied across said resistance element, and a fourth switch group including a plurality of switches inserted between said third common line and said taps, respectively; and logic circuit means for controlling selectively the switching operation of said first to fourth switch groups in dependence on a digital signal to be converted, thereby to produce an analog voltage corresponding to the digital signal from said output line.

2. A digital-to-analog converter according to claim 1, wherein said logic circuit means includes a first logic circuit for controlling the switching operation of the switches of said first, second and third switch groups and a second logic circuit for controlling the switching operation of the switches of said fourth switch group, said first logic circuit including means for producing signals for controlling the switches of said first, second and third switch groups in dependence on values of the second to eighth bits of an eight-bit digital signal in which a first bit is a polarity bit, while said second logic circuit includes means for producing signals for controlling the switches of said fourth switch group in dependence on values of the fifth to eighth bits of said digital signal.

3. A digital-to-analog converter according to claim 2, wherein said second logic circuit is adapted to produce the switch control signal in such a manner that, when the decimal digit value n represented by said fifth to eighth bits of said digital signal corresponds to a given one of the values 1 to 15, one of the switches of said fourth switch group at the n-th positions is turned on, while the switch of said fourth switch group at the n-th position where $n=16$ is turned on when all of said fifth to eighth bits are zero.

4. A digital-to-analog converter according to claim 3, wherein said first logic circuit is adapted to produce said switch control signals in such a manner that, when at least one bit of said fifth to eighth bits is logic "1", the capacitors inclusive of said first capacitor to the capacitor located at a position which corresponds to a decimal digit value m represented by said second to fourth bits are connected to said second common line, while the $(m+1)$-th capacitor is connected to said third common line with the remaining capacitor(s) being connected to said first common line, and when said fifth to eighth bits are all logic "0's", the capacitor at the position corresponding to the decimal digit value m represented by said second to fourth bits is connected to said third common line, while said first to the $(m-1)$-th capacitors are connected to said second common line with the remaining capacitor(s) being connected to said first common line.

5. A PCM encoder comprising:

a voltage comparator for comparing a voltage at an input terminal with a first potential;

a capacitor array circuit including first to eighth capacitors having binary-weighted capacitances in ratio and each having one end thereof connected in common to said input terminal of said voltage comparator, a first common line connected to the other ends of said first to eighth capacitors through respective switches of a first switch group, a second common line connected to the other ends of said first to seventh capacitors through switches of a second switch group, a third common line connected to the other ends of said first to eighth capacitors through switches of a third switch group, and means for changing over said input terminal of said voltage comparator to said first potential and said first common line to a sample signal input terminal in response to the input of a sample signal and for changing over said input terminal of said voltage comparator to a free potential and said first common line to said first potential for an encoding operation;

a resistor string circuit including a resistance element connected between said second common line and a source of said first potential, sixteen taps connected to said resistance element at respective points for deriving voltages which correspond to $(2n-1)/33$ (where n is a given one of the values 1 to 16) of a voltage applied across said resistance element, and switches of a fourth switch group inserted between said third common line and said taps, respectively;

a fifth switch for supplying selectively a reference voltage of positive or negative polarity to said second common line;

a successive approximation register circuit for successively and selectively controlling the switches of said first to fourth switch groups and said fifth switch in dependence on the output from said voltage comparator, thereby to convert said sample signal into a corresponding digital signal to be output; and a pulse generator circuit for producing pulses for controlling the operation of said successive approximation register circuit.

6. A PCM encoder according to claim 5, wherein said successive approximation register circuit includes means for storing a digital code the contents of which are successively altered by the output signal from said voltage comparator, a first logic circuit for controlling switching operations of the switches of said first to third switch groups, and a second logic circuit for controlling the switching operation of the switches of said fourth switch group.

7. A PCM encoder according to claim 6, wherein said digital code storing means includes first means for controlling said fifth switch in dependence on the first bit signal output from said voltage comparator and second means adapted to be initialized by a pulse signal supplied from said pulse generator and to store digital values of said second to eighth bits which are successively determined in dependence on the output signal from said voltage comparator, said first logic circuit including means for producing the switch control signal in dependence on values of said second to eighth bits produced from said second means, while said second logic circuit includes means for producing the switch control signal in dependence on the values of said fifth to eighth bits.

8. A PCM encoder according to claim 7, wherein said second logic circuit is adapted to produce the switch signal in such a manner that, when the decimal digit value n represented by said fifth to eighth bits of said digital signal corresponds to a given one of the values 1 to 15, one of the switches of said fourth switch group at the n-th position is turned on, while the switch of said fourth switch group at the n-th position where n=16 is turned on when all of said fifth to eighth bits are zero.

9. A PCM encoder according to claim 8, wherein said first logic circuit is adapted to produce said switch control signal in such a manner that, when one of said fifth to eighth bits is logic "1", the capacitors inclusive of said first capacitor to the capacitor located at a position which corresponds to a decimal digit value m represented by said second to fourth bits are connected to said second common line, while the (m+1)-th capacitor is connected to said third common line with the remaining capacitor(s) are connected to said first common line, and when said fifth to eighth bits are all logic "0's", the capacitor at the position corresponding to the decimal digit value m represented by said second to fourth bits is connected to said third common line, while said first to the (m−1)-th capacitors are connected to said second common line with the remaining capacitor(s) being connected to said first common line.

*10. A PCM encoder comprising*

*a voltage comparator for comparing a voltage at an input terminal with a first potential;*

*a capacitor array circuit including first to eighth capacitors having binary-weighted capacitances in ratio and each having one end thereof connected to said input terminal of said comparator, a first common line connected to the other ends of said first to eighth capacitors through respective switches of a first switch group, a second common line connected to the other ends of said first to seventh capacitors through switches of a second switch group, and a third common line connected to the other ends of said first to eighth capacitors through switches of a third switch group;*

*a resistor string circuit including a resistance element connected between a reference voltage source and a source of said first potential, sixteen taps connected to said resistance element at respective points for deriving voltages which correspond to (2n−1)/33 (where n is a given one of the values 1 to 16) of a voltage applied across said resistance element, and switches of a fourth switch group inserted between said third common line and said taps, respectively;*

*means including a fifth switch group for applying a voltage, which corresponds to an input signal to be coded, to each of said first to eighth capacitors during a sampling operation and for applying the voltage of said reference voltage source; between said first and second common lines during an encoding operation;*

*a successive approximation logic circuit means for successively and selectively controlling the switches of said first to fourth switch groups and said fifth switch group, the output of said logic circuit means being dependent on the output from said voltage comparator, thereby to convert said voltage across each of said first to eighth capacitors into a corresponding digital signal to be output; and*

*a pulse generator circuit for producing pulses for controlling the operation of said successive approximation logic circuit means.*

*11. A PCM encoder according to claim 10, wherein said successive approximation logic circuit means includes a register for storing a digital code the contents of which are successively altered by the output signal from said voltage comparator, a first logic circuit for controlling switching operations of the switches of said first to third switch groups, and a second logic circuit for controlling the switching operation of the switches of said fourth switch group.*

*12. A PCM encoder according to claim 11, wherein said second logic circuit is adapted to produce the switch signal in such a manner that, when the decimal digit value n represented by said fifth to eighth bits of said digital signal corresponds to a given one of the values 1 to 15, one of the switches of said fourth switch group at the n-th position and when all of said fifth to eighth bits are zero, the switch of said fourth switch group at the 16-th position is turned on.*

*13. A PCM encoder according to claim 12, wherein said first logic circuit is adapted to produce said switch control signal in such a manner that, when one of said fifth to eighth bits is logic "1", the capacitors inclusive of said first capacitor to the capacitor located at a position which corresponds to a decimal digit value m represented by said second to fourth bits are connected to said second common line while the (m+1)-th capacitor is connected to said third common line with the remaining capacitor(s) are connected to said first common line, and when said fifth to eighth bits are all logic "0's", the capacitor at the position corresponding to the decimal digital value m represented by said second to fourth bits is connected to said third common line, while said first to the (m−1)-th capacitors are connected to said second common line with the remaining capacitor(s) being connected to said first common line.*

• • • • •